United States Patent
Kalkschmidt et al.

(10) Patent No.: US 9,723,685 B2
(45) Date of Patent: Aug. 1, 2017

(54) SHORT DETECTION CIRCUIT FOR AN LED DRIVER AND SHORT DETECTION METHOD

(71) Applicant: OLEDWorks GmbH, Aachen (DE)

(72) Inventors: Christian Kalkschmidt, Aachen (DE); Etienne Nicolaas Kathalijntje Paulus Marie Eberson, Echt (NL); Alexander Rudolf Albrecht Isphording, Aachen (DE); Harold Josef Gunther Radermacher, Aachen (DE)

(73) Assignee: OLEDWORKS GMBH, Aachen (DE)

( * ) Notice: Subject to any disclaimer, the term of this patent is extended or adjusted under 35 U.S.C. 154(b) by 0 days.

(21) Appl. No.: 14/913,252

(22) PCT Filed: Aug. 13, 2014

(86) PCT No.: PCT/EP2014/067316
§ 371 (c)(1),
(2) Date: Feb. 19, 2016

(87) PCT Pub. No.: WO2015/024833
PCT Pub. Date: Feb. 26, 2015

(65) Prior Publication Data
US 2016/0212820 A1  Jul. 21, 2016

(30) Foreign Application Priority Data

Aug. 19, 2013 (EP) .................................. 13180922

(51) Int. Cl.
*H05B 37/03* (2006.01)
*H05B 33/08* (2006.01)
*G01R 31/02* (2006.01)
*G01R 31/44* (2006.01)

(52) U.S. Cl.
CPC ....... *H05B 33/0887* (2013.01); *G01R 31/025* (2013.01); *G01R 31/44* (2013.01); *H05B 33/089* (2013.01); *H05B 33/0896* (2013.01)

(58) Field of Classification Search
CPC ............ H05B 33/0887; H05B 33/0896; H05B 33/089; H05B 33/0875; H05B 33/0893; H05B 37/03; G01R 31/025
USPC ...................... 315/291, 307–308, 185 R, 302
See application file for complete search history.

(56) References Cited

U.S. PATENT DOCUMENTS

| | | | |
|---|---|---|---|
| 2010/0156324 A1* | 6/2010 | Nagase | H05B 33/089 315/307 |
| 2012/0206146 A1* | 8/2012 | Avenel | H05B 37/036 324/414 |

* cited by examiner

Primary Examiner — Jimmy Vu
Assistant Examiner — Henry Luong

(57) ABSTRACT

A short detection circuit is provided for detecting a short circuit condition of an LED. A voltage threshold is set which is dependent on the LED operating current, such that there are at least two different voltage thresholds at two different LED operating currents. This means false detections can be reduced and the LED current operating range can be increased over which the short detection functions.

7 Claims, 10 Drawing Sheets

SHORT DETECTION CIRCUIT FOR AN LED DRIVER AND SHORT DETECTION METHOD

FIELD OF THE INVENTION

This invention relates to a short detection method and apparatus for an LED driver.

BACKGROUND OF THE INVENTION

In this description and claims, the term "LED" will be used to denote both organic and inorganic LEDs, and the invention can be applied to both categories. The detailed examples below are based on OLEDs but all examples can use inorganic LEDs instead.

LEDs are current driven lighting units. They are driven using an LED driver which delivers a desired current to the LED.

The required current to be supplied varies for different lighting units, and for different configurations of lighting unit. The latest LED drivers are designed to have sufficient flexibility that they can be used for a wide range of different lighting units, and for a range of numbers of lighting units.

To enable this flexibility, it is known for the driver to operate within a so-called "operating window". An operating window defines a relationship between the output voltage and output current than can be delivered by the driver. Providing the requirements of a particular lighting load fall within this operating window, the driver is able to be configured for use with that particular lighting load, giving the desired driver flexibility.

The driver has its output current set to the desired level within its operating window. This can be achieved by programming the driver to deliver a specific current or by providing current setting information using an input to the driver. This input can be connected to a setting resistor or other component, outside the driver, which is read by the driver. The value of the current setting resistor or other component is measured by the driver, which can then configure its output accordingly, so that the output current is determined by the resistance value. The important point is that after the driver has been produced, the output current can be selected, so that a single driver design is suitable for a range of output currents.

Once the current has been set, the voltage delivered by the driver will vary depending on the load presented to it (since the LEDs are current driven), but the driver will maintain this voltage within the operating window.

LEDs can fail in several ways. One way an OLED can fail is a defect within the organic stack, where the current does not flow in a well-distributed path over the whole lighting surface, but through a single point. This defect is a so-called short. Instead of a typical electrical short, where the resistance is somewhere around 0Ω, the defect of an organic stack behaves like a low ohm resistance. Depending on the used current, a high power consumption may appear which is locally converted into heat within the short point. Therefore a short circuit protection is necessary to keep the short point temperature below a temperature level (e.g. 70° C. surface temperature) or minimize other risks from short circuits as required by safety standards, and to prevent excessive power consumption, where more heat but less light is generated by the OLED.

Typically, the normal operation voltage of an OLED at a given current level is much higher than the voltage which appears in case of a short. Therefore, a short protection can be easily realized by using a comparator circuit which will switch off/bypass the OLED if the voltage is below a defined voltage threshold.

Using a simple threshold test is a crude way to detect a short condition which can result in false detection or it can require the operating range to be compromised. There is therefore a need for an improved approach to the detection of a short condition.

SUMMARY OF THE INVENTION

The invention is defined by the claims.

According to one aspect, there is provided a short detection circuit for detecting a short circuit condition of an LED, comprising:

a voltage threshold setting arrangement for setting a voltage threshold;

a voltage detecting circuit for detecting a voltage dependent on the LED operating voltage; and a comparison circuit for detecting a short based on a comparison of the voltage threshold and the detected voltage, wherein the voltage threshold setting circuit sets a voltage threshold which is dependent on the LED operating current, such that there are at least two different voltage thresholds at two different LED operating currents.

This circuit applies different thresholds at different drive currents. The short circuit threshold defines a lowest permitted voltage level. By setting a lower threshold for a lower drive current, a false short detection is avoided at low operating currents.

For each LED operating current, the voltage threshold can be maintained at a value which corresponds to an operating voltage between the corresponding short circuit voltage (as a lower boundary) and the corresponding operating voltage (as an upper boundary). In this way, the threshold is set according to the current characteristics of the LED.

In one set of examples, the voltage threshold defines:

a ramp function with respect to current; or a function with respect to current comprising a constant level below a minimum current and a ramp function above the minimum current.

The ramp function (or ramp part) can follow the characteristic voltage function which represents a short, so that false short alarms are kept to a minimum.

In another set of examples, the voltage threshold defines a stepped function with respect to current which defines at least two levels, for example at least three levels.

The threshold voltage setting circuit can comprise a resistor divider supplied by a fixed voltage, and a current source which injects a current which is dependent on the LED operating current to the resistor divider. This current injection changes the voltage at the output of the divider so that it is dependent on the LED current. For example, by driving an additional current through only the lower leg of the resistive divider, the divider output voltage will increase.

The current source can be arranged so that it only injects a current when the LED operating current exceeds a threshold. In this way, a step in the threshold can be defined.

A current for the short detection circuit and for the LED is received from an LED driver, and the circuit can comprise a first path for the current through a shunt resistor and the LED in series and a second path for the current through a transistor and a feed resistor to the resistor divider of the threshold voltage setting circuit. In this way, some of the current supplied by the driver is tapped off to the resistor divider when the transistor is turned on. This provides one way of implementing a step function.

Instead of generating a current to represent the LED operating current, the voltage detecting circuit can for example detect the voltage across the series connection of the LED and a shunt resistor, such that the detected voltage comprises a component dependent on the LED operating current. This provides a modification to the monitored voltage in order to implement the desired dependency of the comparison made on the current level.

The threshold voltage setting circuit can comprise a resistor divider supplied by a fixed voltage, and configurable into at least two different configurations in dependence on LED operating current. The LED operating current can for example function as a trigger to switch transistors, and thereby change the resistor divider arrangement.

Thus, it will be appreciated that there are many ways to make the comparison dependent on the current level of the LED.

In all cases, a delay arrangement can be provided such that an output representing a short circuit detection requires a minimum period of short detection by the comparison circuit.

One or more components of the circuit can be selectable in dependence on the characteristics of the LED. In this way, the circuit can be tailored to a specific LED with which it is to be used. In one example, the voltage threshold setting circuit comprises a divider comprising a resistor and an impedance network, which are coupled at the output node of the divider, wherein the impedance network comprises two parallel branches, of a resistor and Zener diode in series in one branch and a Zener diode in the other branch. The components of the impedance network can be those that are externally selected based on the LED to be used.

The invention also provides an LED driver using the short detection circuit of the invention. A lighting system uses this LED driver together with an LED unit powered by the LED driver. The component values of at least some of the components of the short detection circuit then have a value based on the LED characteristics.

The invention also provides a method of detecting a short circuit of an LED, comprising:
  setting a threshold voltage;
  detecting a voltage dependent on the LED operating voltage; and
  detecting a short based on a comparison of the voltage threshold and the detected voltage,
  wherein the voltage threshold setting comprises setting a voltage threshold which is dependent on the LED operating current, such that there are at least two different voltage thresholds at two different LED operating currents.

BRIEF DESCRIPTION OF THE DRAWINGS

Examples of the invention will now be described in detail with reference to the accompanying drawings, in which.

DETAILED DESCRIPTION

The invention provides a short detection circuit for detecting a short circuit condition of an LED. A voltage threshold is set which is dependent on the LED operating current, such that there are at least two different voltage thresholds at two different LED operating currents. This means false detections can be reduced and the LED current operating range can be increased over which the short detection functions.

The invention will be explained with reference to OLEDs.

Figure 1:
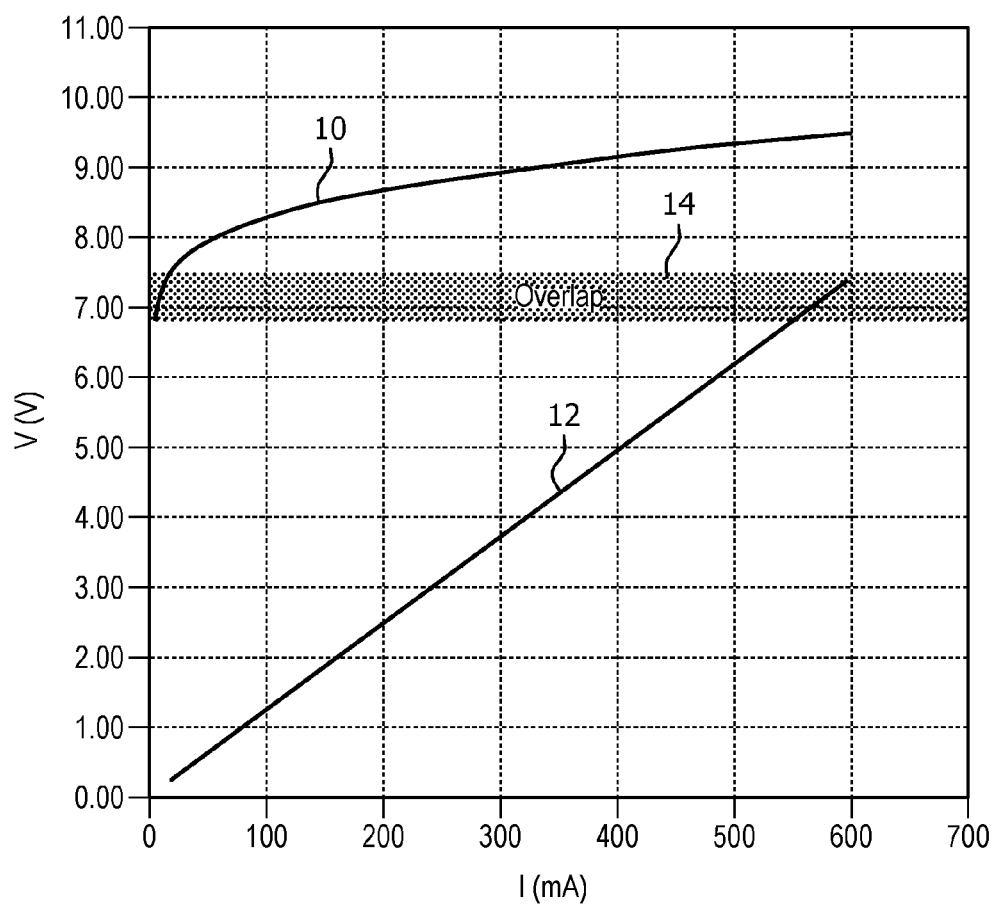
FIG. 1 shows the operating voltage and shorting voltage for one example of LED with respect to operating current.

A typical current-voltage characteristic of an OLED is shown in FIG. 1. Plot 10 shows the normal operating voltage as a function of current, and plot 12 shows the voltage behaviour of a shorted OLED.

The overlap 14 between the normal operation voltage and the short operation voltage illustrates the disadvantage of using one simple voltage threshold for different current values. If only one threshold value is implemented, a compromise between the highest and the lowest possible current level might be necessary if there is an overlap of the short voltage at high current levels and the operation voltage at low current levels. This limits the maximum current through the OLED (and, as a result, OLED brightness). Another disadvantage is the ramp-up behaviour of a typical driver which normally needs some time to provide the requested current by increasing it from zero to the desired level. This requires an additional delay for the voltage detection, otherwise it might be possible that the ramp-up voltage of the OLED is below the voltage threshold and the protection circuit will disable the OLED although it is not damaged.

As seen in FIG. 1, the normal operation voltage of an OLED at one given current level is always higher than the voltage in the case of short damage. To eliminate the disadvantage of the overlapped voltage area 14, it is possible to replace a fixed voltage threshold, which is valid for the whole current range, by a dynamic voltage threshold, so that there are least two different threshold levels for different current ranges.

The voltage threshold is then defined based on the current level. The short detection then involves using the voltage threshold as determined by measurement or knowledge of the actual set current level.

For the calculation of the threshold voltage to be used, many different relationships can be used. It is preferred for all relationships that the calculated threshold value is always above the short voltage of the OLED at a given current level and below the operation voltage of the OLED at that current level.

Figure 2:
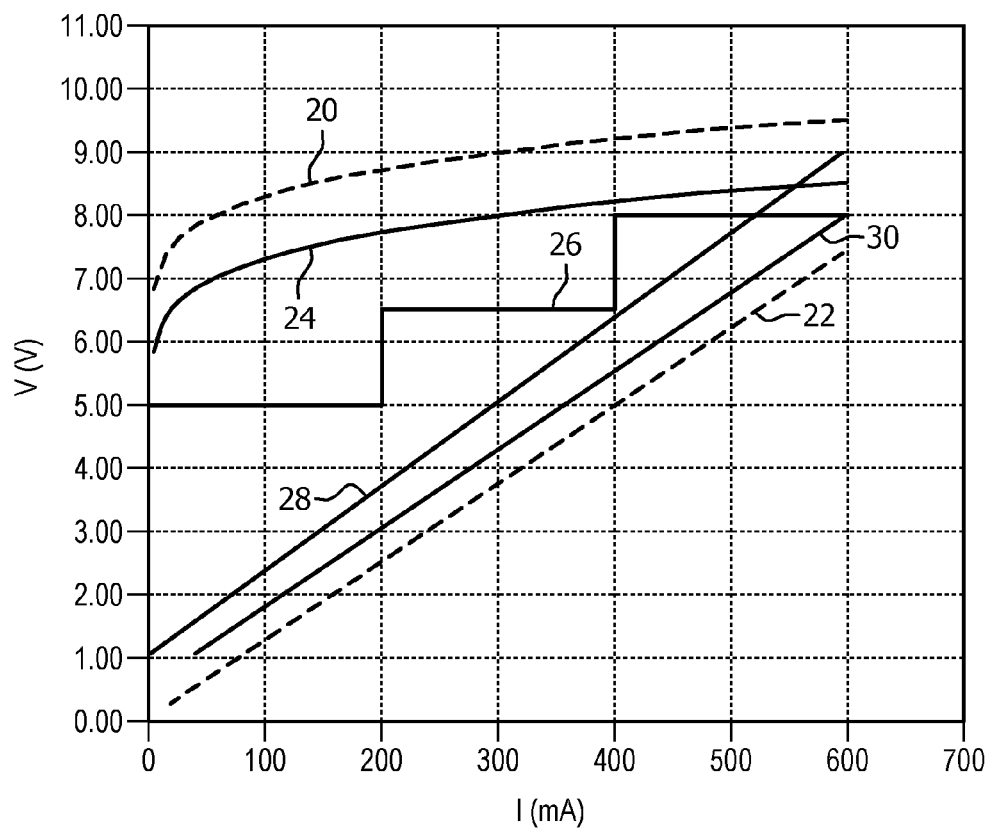
FIG. 2 shows various possible threshold voltage functions to be used in a circuit detection circuit and method of the invention.

FIG. 2 illustrates examples of different voltage threshold curves depending on current, in accordance with the invention.

In order to overcome the problem explained with reference to FIG. 1, at least two threshold levels are required. FIG. 2 shows four possible examples of threshold setting curve.

Plot 20 shows the normal operating voltage as a function of current for a particular design of OLED. Plot 22 shows the corresponding voltage at which a short circuit is considered to have taken place. The threshold curves 24,26,28,30 provide levels below which a short can be determined to have arisen.

Plot 24 shows an example which follows the normal operating voltage, but a step in voltage lower. Thus, as soon as the voltage drops by a certain amount below the normal operating voltage, a short can be deemed to have arisen.

Plot 26 shows a stepped function which steps between three levels at two different switching points along the current axis. At the limit there may be one switching point and two levels.

Plot 28 shows a ramp function, and plot 30 shows a ramp function with an initial flat part where the threshold voltage is constant for currents below a minimum which in this example is 50 mA.

The dynamic aspect of the voltage threshold relates to the current dependency. However, it may additionally include filtering in time, for example in order to prevent problems during ramp-up (start-up) around low current.

A first implementation of the invention can be a software based approach.

Any of the threshold functions shown can be implemented in software in a microcontroller, which controls the LED driver IC and therefore knows the current setting, and measures continuously the OLED voltage.

In this case, the microcontroller performs the functions of setting a threshold voltage Vth which is dependent on the LED operating current, such that there are at least two different voltage thresholds at two different LED operating currents. The LED driver typically includes a voltage detection arrangement for detecting the LED operating voltage (or else a voltage dependent on the LED operating voltage), and this is fed back to the microcontroller, which then implements the short detection function, by comparing, in software, the voltage threshold and the voltage dependent on the LED operating voltage.

In this case, the threshold voltage setting arrangement is a microcontroller which uses software to define a relationship between voltage and current. This controller can be implemented by the main LED driver controller.

Various hardware implementations will now also be discussed.

The hardware implementations are based on the understanding that both information of the actual forward current and the actual forward voltage is present in the driver in an analogue representation, e.g. as a voltage drop across a current measurement resistor or from an output voltage measurement circuit.

Figure 3:
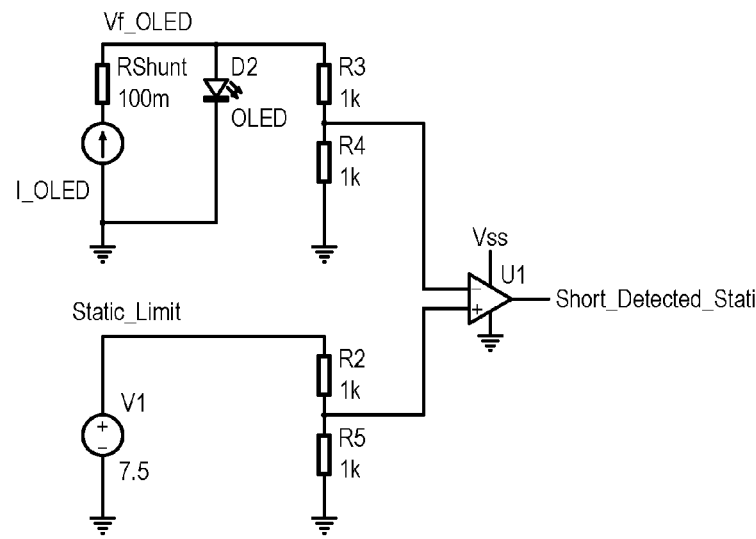
FIG. 3 shows a known short circuit detection arrangement and corresponding function waveforms.
Figure 3:
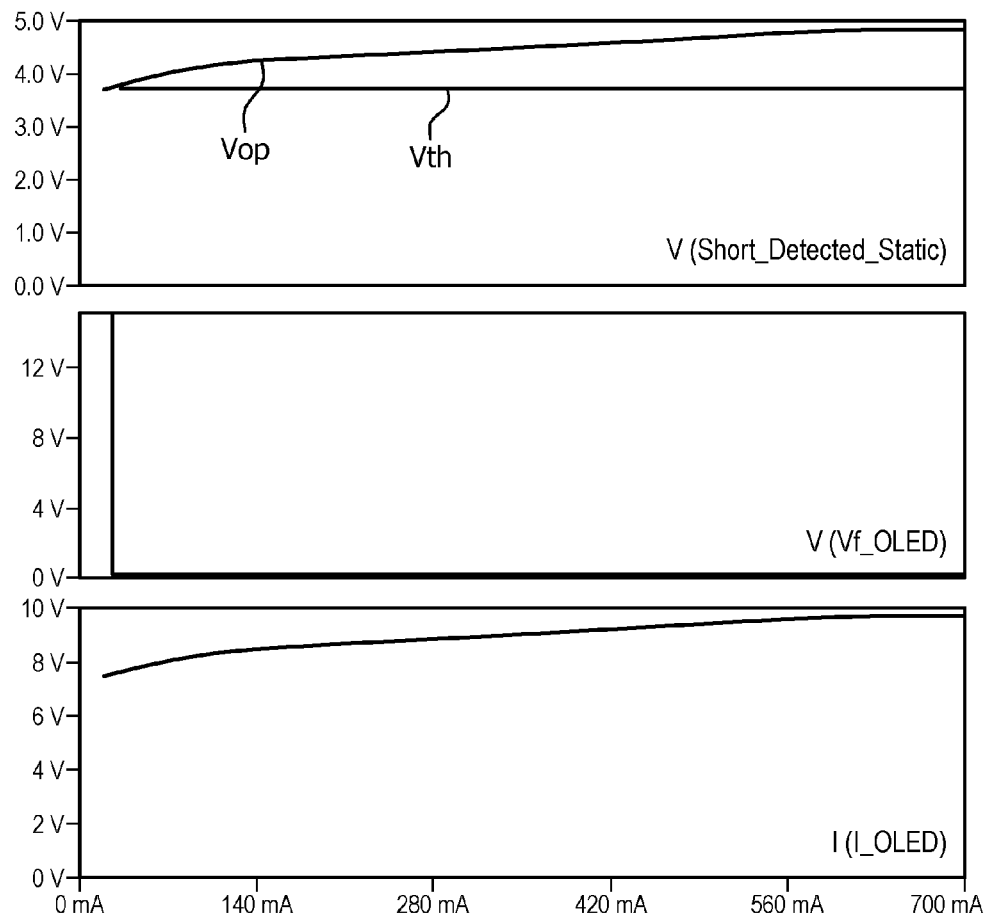

FIG. 3 shows an example of comparator circuit which implements a fixed voltage threshold. The circuit is shown to the left and graphs are shown to the right to explain the operation. The top graph shows the threshold Vth provided to one input of the comparator U1 and the other voltage Vop provided to the comparator based on the operating voltage as a function of current. This voltage Vop can for example be a scaled version of the operating voltage to make it comparable with the threshold and suitable for the comparator. The middle plot shows the detection signal, where a high output denotes detection of a short. It shows a false detection at low currents. The bottom plot shows the operating voltage.

As explained above, when there is a low driver current, the comparator voltage derived from the forward voltage of the OLED is lower than the threshold value, hence a short circuit will be detected, although this is not present.

The circuit comprises the LED driver, represented as a current source I_OLED which supplies the LED and a shunt resistor Rshunt. The voltage across the OLED is provided to a resistor divider R3,R4 and a reference voltage is provided to a second resistor divider R2,R5. These two resistor divider outputs are compared by the comparator U1. In this way, conceptually the operating voltage is compared with a threshold, although both are scaled by respective resistive dividers to be in the operating range of the comparator.

Simply lowering the threshold value would result in the fact that a real short which normally occurs as an ohmic connection from anode to cathode, is NOT detected at higher forward currents, hence the required short circuit protection is not achieved.

It is noted that the labels Vth and Vop are used in the same way in the other figures, and the resistor dividers are always shown as R3,R4 and R2,R5. The comparator is always shown as U1. The explanation of these components will not be repeated, and they will only be discussed when their function has been modified by the particular example. The second and third plots always show the same information in FIGS. 3 to 7, and the discussion is based on the top plot which shows the different approaches being taken.

To solve the problem outlined above, the threshold value, below which a short is detected, is made to depend on the forward current to the OLED.

Figure 4:
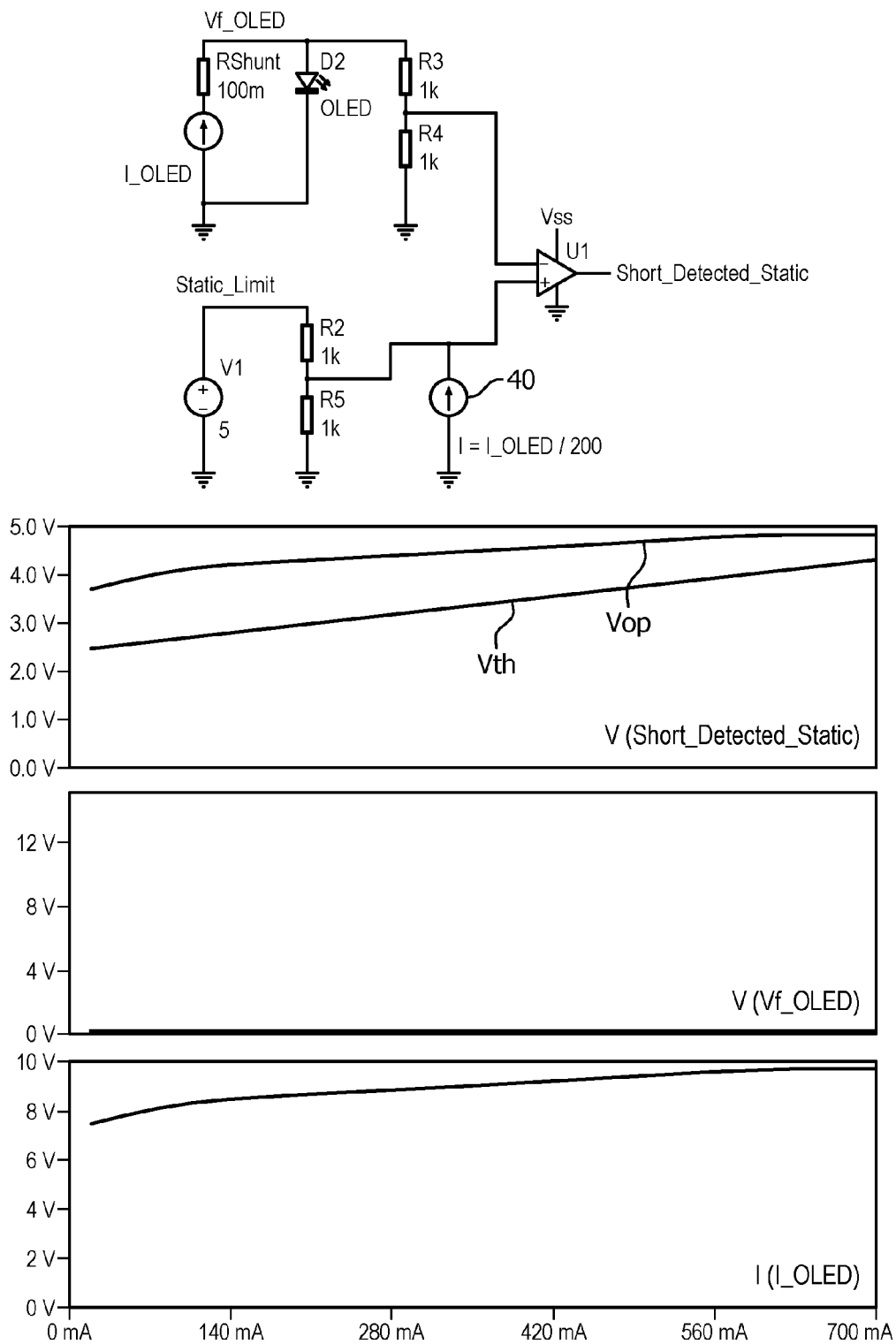
FIG. 4 shows a first embodiment of short circuit detection arrangement and corresponding function waveforms.

FIG. 4 shows a first example, which differs from the example of FIG. 3 in that a representative copy of the forward current I_OLED is injected into the threshold signal. This current is represented by current source 40, and in the example shown it is 1/200 times the LED operating current. This can be derived using a current mirror circuit. This has the effect of increasing the output voltage of the resistive divider R2,R5 at higher drive current. In turn, this enables the initial value at low current to be reduced. The effect on the threshold voltage Vth can be seen in the top plot. The middle plot shows that there is no longer a false short detection at low current.

Figure 5:
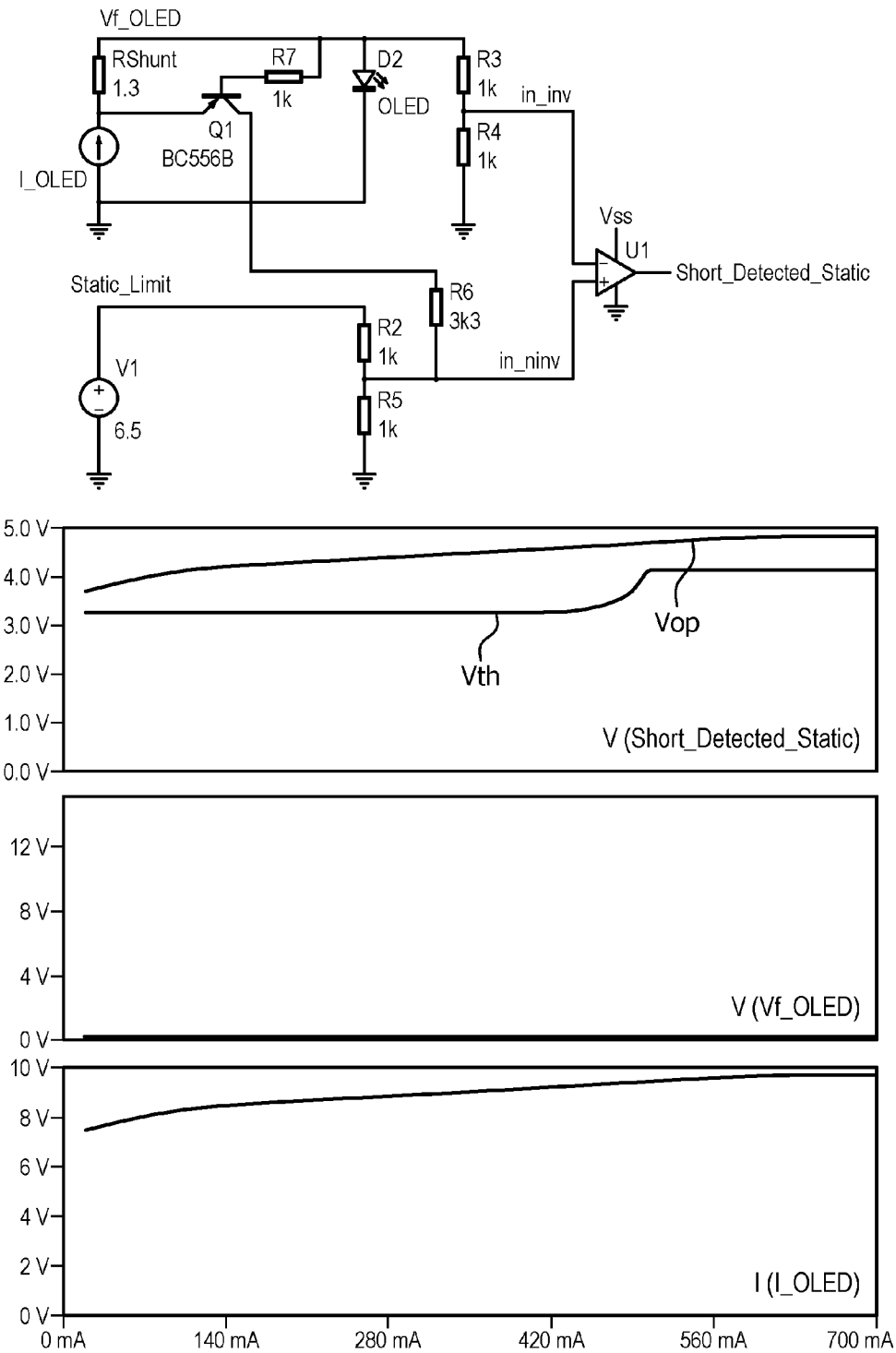
FIG. 5 shows a second embodiment of short circuit detection arrangement and corresponding function waveforms.

A possible realization of the current injection current source is shown in FIG. 5, and also arranged to have a step response rather than the linear response shown in FIG. 4.

In FIG. 5, the LED driver current I_OLED is provided both to the shunt resistor and OLED as one branch, but also to another branch in the form of a bipolar transistor Q1 and resistor R6 in series which leads to the output of the resistor divider R2,R5.

The shunt resistor Rshunt is connected across the base-emitter junction, so that the voltage across the shunt resistor determines if the transistor is turned on.

For low currents, the voltage drop across the shunt resistor is too small to turn on the transistor Q1 so that the second branch has no effect, and the threshold voltage is constant. When a certain current is reached, the transistor turns Q1 on and a current is driven through R6 which injects into the resistor divider R2,R5.

As shown in the top plot, this current injection arrangement provides a step in the threshold voltage function Vth. After the step, there is a ramping threshold voltage, since the injected current will depend on the voltage.

Figure 6:
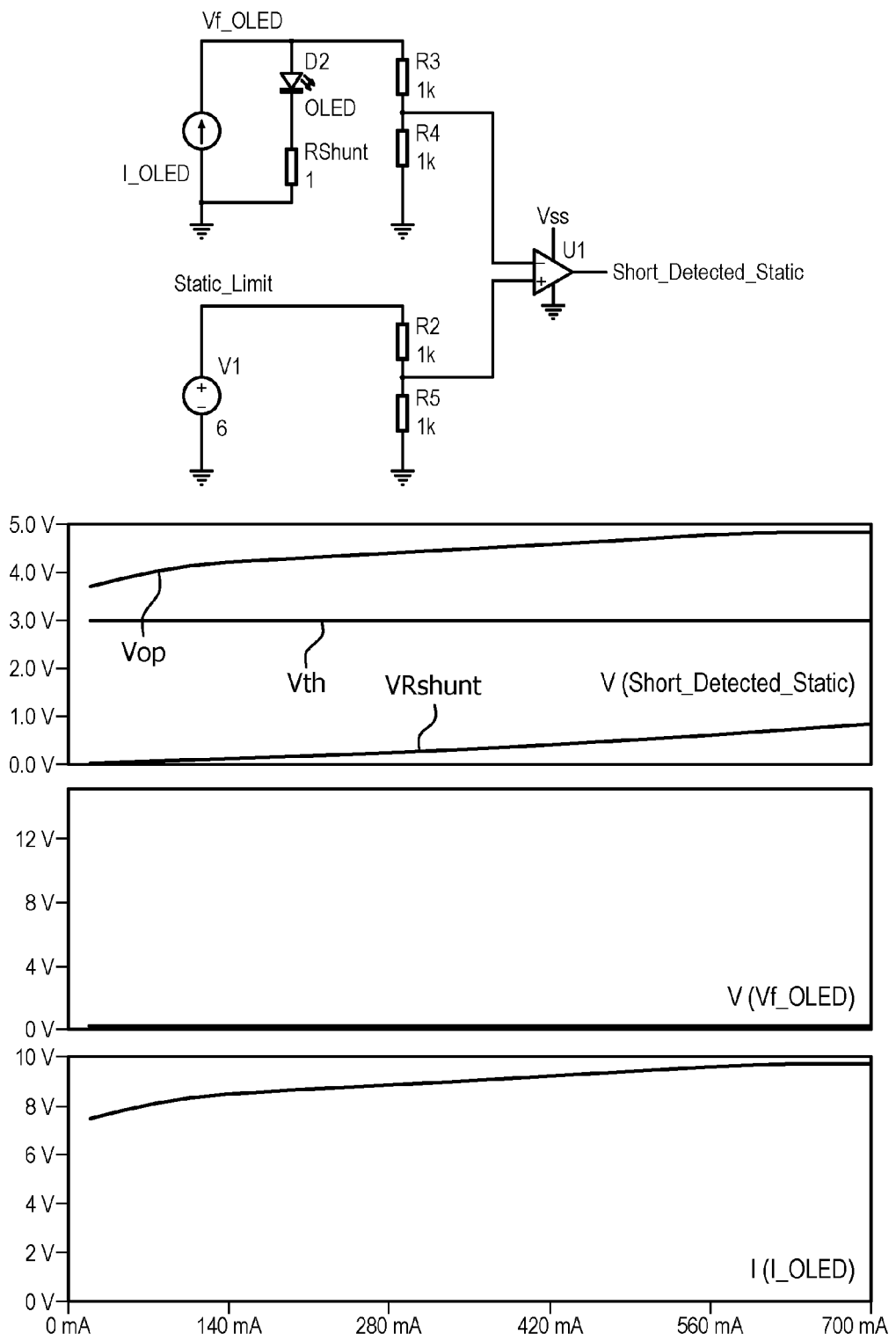
FIG. 6 shows a third embodiment of short circuit detection arrangement and corresponding function waveforms.

As an alternative, the current information can be coupled with the sensed voltage of the OLED, as shown in FIG. 6.

The LED driver again delivers a current I_OLED to the OLED and shunt resistor, but the monitored voltage is the voltage across both, rather than the voltage across the OLED only. This means the voltage Vop provided to the resistor divider R3,R4 includes a component which is the OLED voltage and a component which is the voltage across the shunt resistor. This shunt resistor component is current dependent, and is represented by VRshunt By increasing Vop with current, the same effect is obtained as increasing Vth with current, but as shown in the plot, the threshold voltage is constant.

Figure 7:
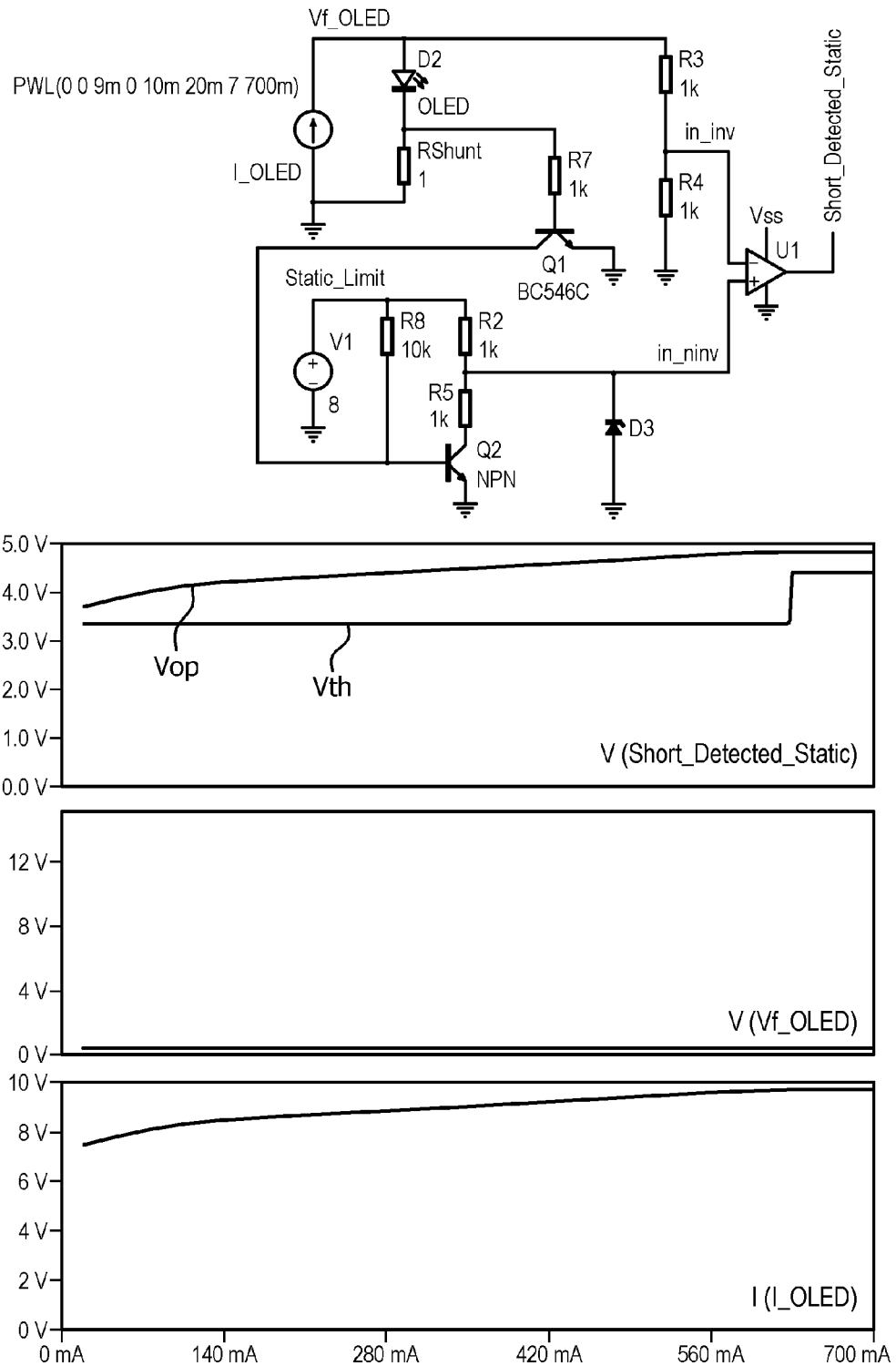
FIG. 7 shows a fourth embodiment of short circuit detection arrangement and corresponding function waveforms.

FIG. 7 shows a circuit which combines sensing of the OLED shunt resistor voltage (as in FIG. 6) with a step in the threshold voltage.

The voltage across the shunt resistor again drives a bipolar transistor Q1 using a sense resistor R7, so there is a current at which it turns on. Thus, the shunt resistor effectively implements a step in the threshold voltage Vth.

Before it is turned on, the resistor divider R2,R5 functions as above. There is a second bipolar transistor Q2 at the base of the resistor divider, but this is turned on by a voltage source V1 and base resistor R8.

When the transistor Q1 is turned on, the second transistor Q2 has its base pulled to ground and is turned off. The threshold voltage is no longer defined by the resistor divider R2,R5 but instead is determined by a Zener diode D3 which is connected between the output of the divider R2,R5 and ground.

The step in threshold voltage can be seen in the top plot.

In the circuits above, the output signal for indicating a short condition is generated instantaneously. However, a time delay can be realized, in order to avoid false triggering of the short detector.

Figure 8:
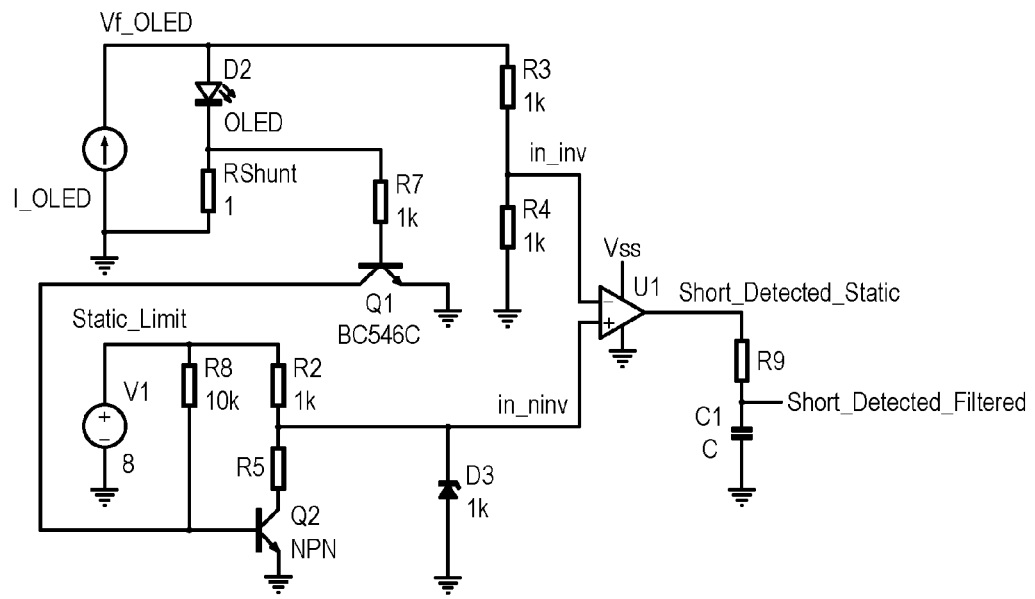
FIG. 8 shows a fifth embodiment of short circuit detection arrangement in which a delay element has been added.

FIG. 8 shows the circuit of FIG. 7 with a low pass filter at the output defined by resistor R9 and capacitor C1.

The threshold of the circuit preferably depends on the type of OLED, and this dependency is preferably linked to the OLED in a convenient way, such that no manipulation/setting/adjustment of the driver and/or circuit is required.

For example, one or more components of the circuit are selectable in dependence on the characteristics of the LED.

Figure 9:
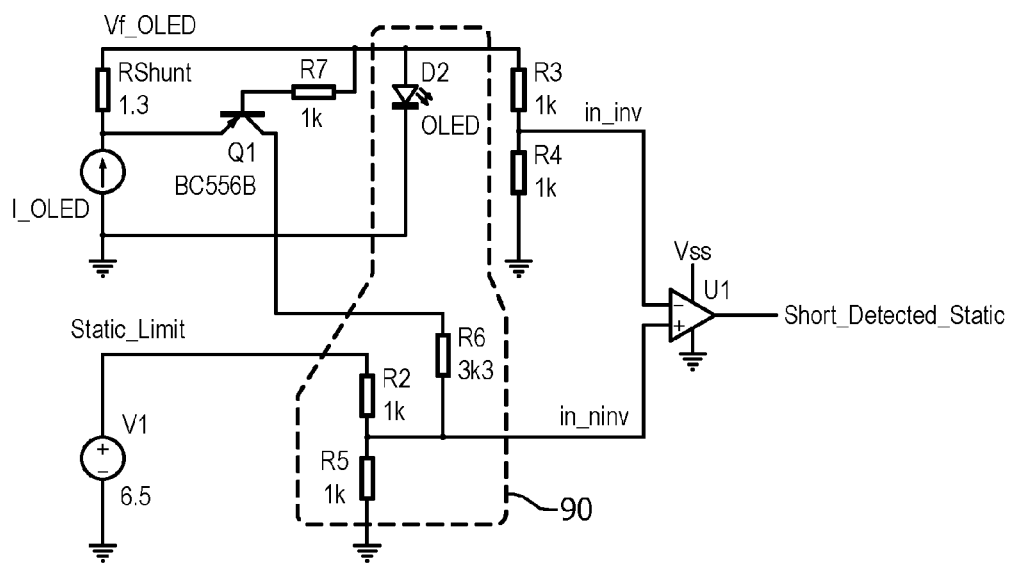
FIG. 9 shows how circuit components can be tuned to tailor the circuit function to a particular LED.

FIG. 9 shows the circuit of FIG. 5 and shows three components and their associated OLED within the region 90, which components can be used for setting the threshold and/or manipulating the sensed voltage. Thus, the circuit can have components for programming the forward current (in known manner), and also components for programming the reference values for the short circuit protection.

Figure 10:
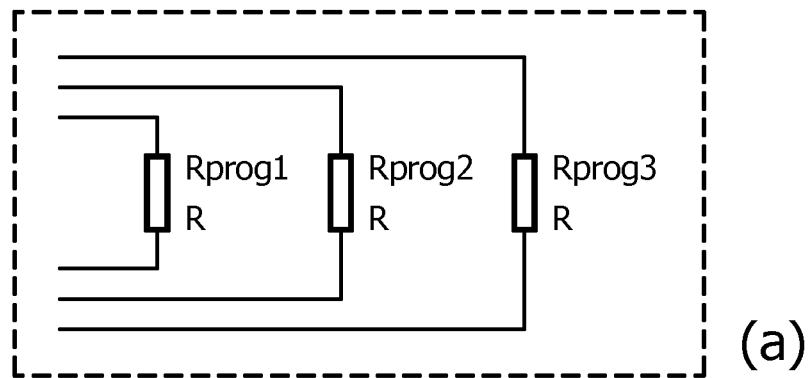
FIG. 10 shows three examples of circuit parts which can be selected to provide tuning of the overall circuit.
Figure 10:
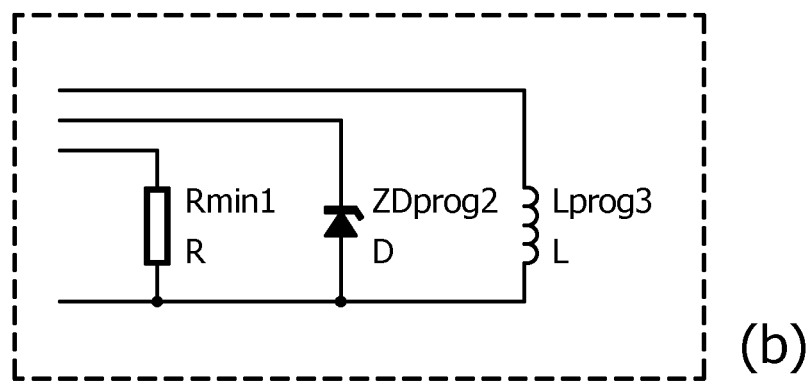
Figure 10:
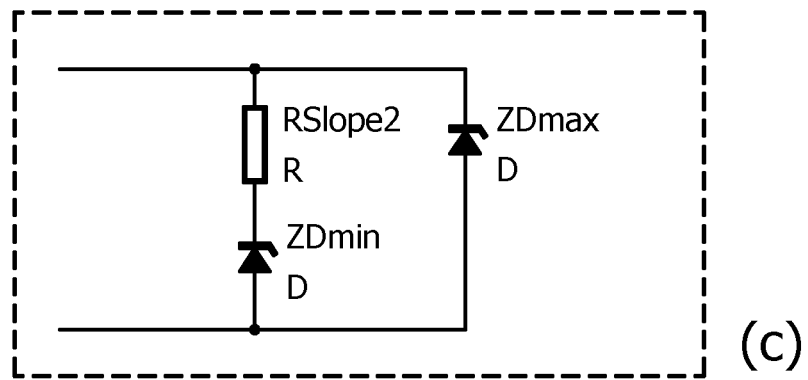

FIG. 10 shows some possible components which can be used by the LED driver to determine its internal settings.

FIG. 10(a) shows individual programming resistors. These individual resistors can be used as resistors R2,R5 and R6 in FIG. 9. By providing them as part of the OLED circuit rather than the driver circuit, when connecting the driver circuit to the OLED circuit, the OLED circuit will configure the driver in a suitable way.

While being very flexible, this comes at the cost of a high number of connectors and wires between the driver and the OLED.

As a variant, other devices, such as a diode or reactive components can be used, for example as shown in FIG. 10(b).

FIG. 10(c) shows a variation in which some wires and connections are shared, such that the total amount of pins is reduced. In this example only two connections are used for the programming.

The circuit of FIG. 10(c) comprises an impedance network in the form of two parallel branches, of a resistor and Zener diode in series in one branch and a Zener diode in the other branch.

Figure 11:
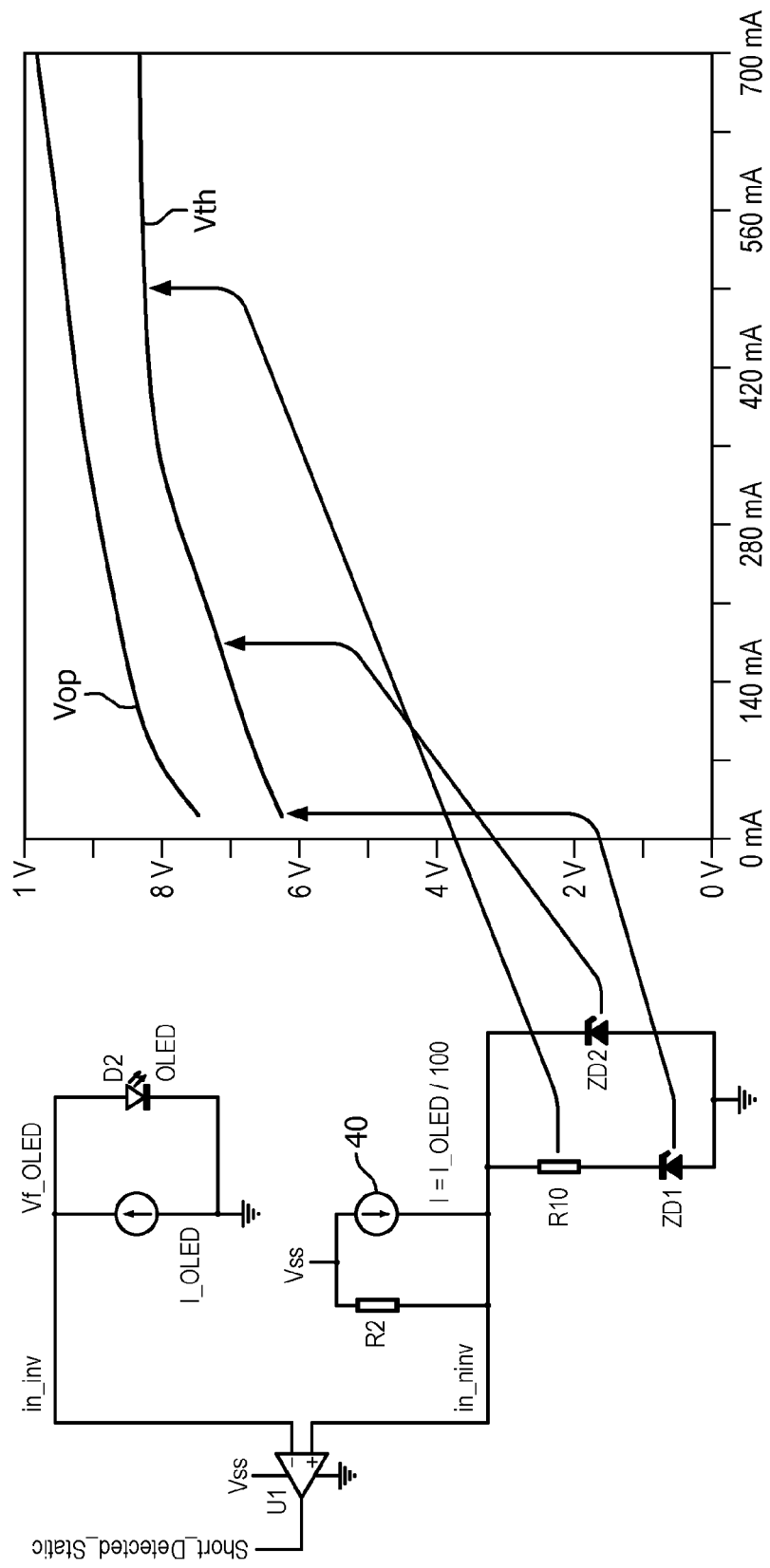
FIG. 11 shows one example of circuit with tuning part.

FIG. 11 shows a circuit using the circuit arrangement of FIG. 10(c).

The voltage detecting circuit is shown in simplified form, since FIG. 11 is simply used to show how the circuit of FIG. 10(c) is used to form the threshold voltage setting circuit. For example the shunt resistor of the voltage detecting circuit is omitted in FIG. 11, although this will be present and is used to form the current of the current source 40 (I=I_OLED/100 for example).

Like the circuit of FIG. 4, the circuit of FIG. 11 shows only schematically the current source 40 which copies the OLED current, and in this example the ratio is 1/100. The divider for the threshold voltage comprises the top resistor R2 and the impedance network of FIG. 10(c) as the bottom element. Since this impedance network includes a resistor, the circuit of FIG. 11 essentially comprises a modified resistor divider circuit.

The driver injects a current which is formed of an offset current injected by R2 and the current dependent on the forward OLED current as shown by current source 40 into the short protection circuit. The voltage across the impedance network functions as the threshold value to be compared with actual value of the OLED voltage in this example (instead of using a scaled version as in the other examples).

In this example, the Zener diode ZD1 defines the minimum voltage of the threshold curve Vth at low forward currents, ZD2 defines the minimum voltage at high forward current, and R10 defines the slope of the transition phase between.

For further reduction of wires, at least one of the signals from the short protection circuit may be shared with any other signal to the OLED.

Scaling of the voltages (as with R3 and R4) and any of the other alternative features discussed before can also be applied.

As mentioned above, the threshold can be implemented in software by suitable programming of the LED driver. The driver can calculate the dynamic short threshold voltage by an internal microcontroller which controls a driver IC.

The hardware solutions can be implemented in the driver itself or, if separation from an existing driver (e.g. a standard LED driver) is preferred, in an additional protection circuit in parallel to the OLED device.

The invention is of interest for organic and inorganic LED drivers.

The software version of the invention makes use of a controller. The controller can be implemented in numerous ways, with software and/or hardware, to perform the various functions required. A processor is only one example of a controller which employs one or more microprocessors that may be programmed using software (e.g., microcode) to perform the required functions. A controller may however be implemented with or without employing a processor, and also may be implemented as a combination of dedicated hardware to perform some functions and a processor (e.g., one or more programmed microprocessors and associated circuitry) to perform other functions.

Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media such as volatile and non-volatile computer memory such as RAM, PROM, EPROM, and EEPROM. The storage media may be encoded with one or more programs that, when executed on one or more processors and/or controllers, perform at the required functions. Various storage media may be fixed within a processor or controller or may be transportable, such that the one or more programs stored thereon can be loaded into a processor or controller.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A short detection circuit for detecting a short circuit condition of an LED, comprising:
    a voltage threshold setting arrangement (R2, RS) for setting a voltage threshold (Vth), wherein the voltage threshold (Vth) defines a stepped function with respect to current which defines at least three levels;
    a voltage detecting circuit (R3, R4) for detecting a voltage (Vop) dependent on the LED operating voltage; and
    a comparison circuit (UI) for detecting a short circuit voltage based on a comparison of the voltage threshold and the detected voltage, wherein the voltage threshold setting circuit (R2, RS) sets a voltage threshold (Vth) which is dependent on the LED operating current, such that there are at least two different voltage thresholds at two different LED operating currents, and wherein for each LED operating current the voltage threshold (Vth) corresponds to a voltage between the corresponding short circuit voltage and the corresponding operating voltage.

2. A circuit as claimed in claim 1, wherein the threshold voltage setting arrangement comprises a resistor divider (R2, RS) supplied by a fixed voltage, and a current source (40) which injects a current which is dependent on the LED operating current to the resistor divider (R2, RS).

3. A circuit as claimed in claim 2, wherein the current source (40) only injects a current when the LED operating current exceeds a threshold.

4. A circuit as claimed in claim 3, wherein a current is received from an LED driver, and the circuit comprises a first path for the current through a shunt resistor (RShunt) and the LED in series and a second path for the current through a transistor (Q1) and a feed resistor (R6) to the resistor divider of the threshold voltage setting circuit.

5. A circuit as claimed in claim 1, wherein the voltage detecting circuit (R3, R4) detects the voltage across the series connection of the LED and a shunt resistor (RShunt), such that the detected voltage comprises a component dependent on the LED operating current.

6. A circuit as claimed in claim 1, wherein the threshold voltage setting arrangement comprises a resistor divider (R2, RS) supplied by a fixed voltage, and configurable into at least two different configurations in dependence on LED operating current.

7. A method of detecting a short circuit of an LED, comprising:
    setting a threshold voltage(Vth) wherein the voltage threshold (Vth) defines a stepped function with respect to current which defines at least three levels;
    detecting a voltage (Vop) dependent on the LED operating voltage; and detecting a short circuit voltage based on a comparison of the voltage threshold and the detected voltage, wherein the voltage threshold setting comprises setting a voltage threshold (Vth) which is dependent on the LED operating current, such that there are at least two different voltage thresholds at two different LED operating currents, and
    such that for each LED operating current the voltage threshold (Vth) corresponds to a voltage between the corresponding short circuit voltage and the corresponding operating voltage.

* * * * *